United States Patent
Klostermann

(10) Patent No.: US 7,663,198 B2
(45) Date of Patent: Feb. 16, 2010

(54) MAGNETORESISTIVE RANDOM ACCESS MEMORY DEVICE WITH ALTERNATING LINER MAGNETIZATION ORIENTATION

(75) Inventor: Ulrich Klostermann, Zwiesel (DE)

(73) Assignees: Qimonda AG, Munich (DE); ALTIS Semiconductor, SNC, Corbeil Essonnes Cedex (FR)

(*) Notice: Subject to any disclaimer, the term of this patent is extended or adjusted under 35 U.S.C. 154(b) by 528 days.

(21) Appl. No.: 11/512,066

(22) Filed: Aug. 29, 2006

(65) Prior Publication Data

US 2008/0054385 A1 Mar. 6, 2008

(51) Int. Cl.
  *G11C 11/15* (2006.01)
  *H01L 21/8246* (2006.01)
(52) U.S. Cl. .............. 257/427; 257/E21.665; 365/158
(58) Field of Classification Search .......... 257/427, 257/E21.665; 365/158, 171, 173
See application file for complete search history.

(56) References Cited

U.S. PATENT DOCUMENTS

| | | | | |
|---|---|---|---|---|
| 6,707,711 B2* | 3/2004 | Saito et al. | | 365/158 |
| 6,970,376 B1* | 11/2005 | Fukuzumi | | 365/158 |
| 7,312,506 B2* | 12/2007 | Wang et al. | | 257/427 |
| 7,510,883 B2* | 3/2009 | Chung et al. | | 438/3 |
| 2003/0111626 A1* | 6/2003 | Hosotani | | 251/200 |
| 2004/0057395 A1* | 3/2004 | Sakuma | | 370/318 |
| 2004/0100855 A1* | 5/2004 | Saito et al. | | 365/232 |
| 2008/0006890 A1* | 1/2008 | Haratani et al. | | 257/427 |

OTHER PUBLICATIONS

Varga, Edlt, "Domain wall motion in permalloy wires," University of Notre Dame, IN, USA, 12 pages.
Kirk, K.J., et al., "Switching fields and magnetostatic interations of thin film magnetic nanoelements," Applied Physics Letters, vol. 71, No. 4, Jul. 28, 1997, pp. 539-541.

* cited by examiner

*Primary Examiner*—Lynne A. Gurley
*Assistant Examiner*—Andrew O. Arena
(74) *Attorney, Agent, or Firm*—Slater & Matsil, L.L.P.

(57) ABSTRACT

An arrangement of magnetic liners for the bit lines or word lines of an MRAM device that reduces or eliminates stray magnetic fields at the ends of the magnetic liners, thereby reducing the occurrence of offset fields over portions of the MRAM device due to the magnetic liners is described. The orientation of magnetization of adjacent magnetic liners is alternated, causing the end poles of the magnetic liners to cancel each other. The shapes of the ends of the magnetic liners are alternated to vary their switching fields. Methods are described that use this ability to vary the switching fields to alternate the orientation of magnetization of the magnetic liners.

22 Claims, 5 Drawing Sheets

Provide magnetic liners that have alternating end shapes so switching fields alternate between low switching field $H_{c1}$ and high switching field $H_{c2}$ — 600

Apply External Magnet Field $H_a$, such that $H_a > H_{c2} > H_{c1}$ — 605

Apply External Magnet Field $H_b$, with a field component anti-parallel to the external magnet field $H_a$ and such that $H_{c2} > H_b > H_{c1}$ — 610

MAGNETORESISTIVE RANDOM ACCESS MEMORY DEVICE WITH ALTERNATING LINER MAGNETIZATION ORIENTATION

TECHNICAL FIELD

The present invention relates generally to MRAM (Magnetoresistive Random Access Memory) devices, and more particularly to the design of magnetic liners (also called cladding) for use in such devices.

BACKGROUND

One emerging technology for non-volatile memory is magnetoresistive random access memory (MRAM). At present, the most common form of MRAM is based on the tunneling magnetoresistance (TMR) effect, in which each memory cell includes a magnetic tunnel junction (MTJ). Such an MTJ may be formed from two ferromagnetic metal layers, with an insulating layer placed between the metal layers. When a voltage is applied between the metal layers, a tunnel current flows. The tunnel resistance varies based on the relative directions of magnetization of the metal layers. The tunnel resistance is small when the directions of magnetization are parallel (typically representing a "0"), and large (approximately 30%-300% higher, at room temperature) when the directions of magnetization are anti-parallel (typically representing a "1").

The metal layers in a typical MRAM MTJ include a "hard" layer, in which the direction of the magnetization is fixed, and a "soft" layer, in which the direction of the magnetization can be switched by application of currents. These currents are applied through conductive write lines referred to as bit lines and word lines, which are disposed so that the bit lines are orthogonal to the word lines. In an MRAM array, an MTJ memory cell is located at each intersection of a bit line with a word line.

To switch the direction of magnetization of the soft layer of a particular cell, currents are applied through the bit line and the word line that intersect at that cell. The direction of these currents determines the direction in which the magnetization of the soft layer will be set. The combined magnitude of the currents through the word and bit lines must be sufficient to generate a magnetic field at their intersection that is strong enough to switch the direction of magnetization of the soft layer.

In some MRAM devices, the bit and word lines may be partially surrounded by a magnetic liner (also called cladding), which serves to focus the magnetic field in the direction of the soft layer. Through use of such a liner, the amount of current that is required to generate a magnetic field sufficient to switch the direction of magnetization of the soft layer is substantially reduced. Additionally, use of a magnetic liner on the word and/or bit lines may partially shield the magnetic field from adjacent memory cells, preventing inadvertent switching of adjacent memory cells.

However, use of magnetic liners for the bit and/or word lines may cause difficulties, because the magnetic liners produce stray magnetic fields originating from their end regions. These stray fields may cause an inhomogeneous offset field over portions of the MRAM array. This could cause, for example, areas of the array that are near the ends of the magnetic liner to require a different current to generate a magnetic field sufficient to switch the direction of magnetization in memory cells, which may cause cells in these regions to be inadvertently switched.

One approach to avoiding the problems associated with stray fields caused by the use of magnetic liners is to extend the liners beyond the region in which MTJ memory cells are present. Using this approach, the areas around the ends of the liner, which are subject to stray magnetic fields, are not used for memory cells. While this will avoid the difficulties associated with use of liners, it also substantially reduces the area of a device that is usable for MTJ memory cells.

Another way in which these difficulties may be avoided is through use of circuitry that offsets the effects of the stray magnetic fields in regions of the MRAM device that are near the ends of the magnetic liners. The stray magnetic fields may be measured, and circuitry added to the MRAM device to compensate for their effects. Of course, this added circuitry will increase the complexity of the MRAM device, and will require space on the device, reducing the space that may be used for MTJ memory cells.

What is needed is a design for magnetic liners for the word and/or bit lines of an MRAM that substantially reduces the stray fields originating at the ends of the liners, without substantially increasing the complexity of the MRAM device, or reducing the area of the device that is usable for memory cells.

SUMMARY OF THE INVENTION

The present invention provides an arrangement of magnetic liners for the bit lines or word lines of an MRAM device that reduces or eliminates the stray fields at the ends of the magnetic liners, and reduces the occurrence of offset fields over portions of the MRAM device. In accordance with the present invention, this is achieved by alternating the orientation of magnetization of adjacent magnetic liners, causing the magnetic fields at the ends of the magnetic liners to cancel each other. Advantageously, this reduces or eliminates the stray fields without increasing the complexity of the circuitry, and without substantially reducing the area of an MRAM device that may be used for memory cells.

In accordance with one aspect of the invention, alternating the orientation of magnetization of the magnetic liners may be achieved by alternating the shapes of the ends of the magnetic liners to affect their switching fields (the strength of the magnetic field that is needed to switch the magnetization orientation of the magnetic liner). In one example, magnetic liners having blunt ends have a lower switching field than magnetic liners having pointed ends. Because of this difference in switching fields, a magnetic field may be applied to the magnetic liners that is strong enough to switch the magnetization orientation of the magnetic liners having blunt ends (due to their lower switching field), without switching the magnetization orientation of the liners having pointed ends. This ability may be used to alternate the orientation of magnetization of the magnetic liners.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

Figure 1:
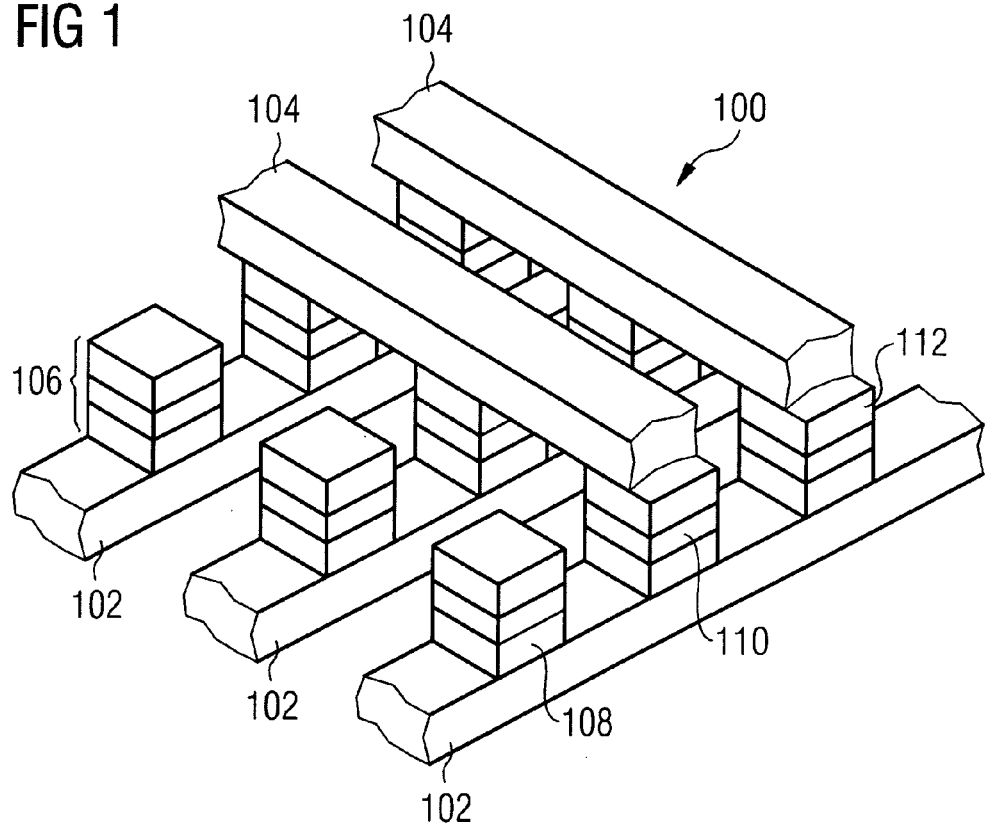
FIG. 1 shows a perspective view of an MRAM array.

FIG. 1 shows a perspective view of an MRAM array 100 having bit lines 102 disposed in an orthogonal direction to word lines 104 in adjacent metallization layers. Magnetic memory stacks 106 are electrically coupled to the bit lines 102 and word lines 104 (collectively, write lines), and are positioned between the bit lines 102 and word lines 104 at locations where a bit line 102 crosses a word line 104. The magnetic memory stacks 106 are preferably magnetic tunnel junctions (MTJs), comprising multiple layers, including a soft layer 108, a tunnel layer 110, and a hard layer 112. The soft layer 108 and hard layer 112 preferably comprise a plurality of magnetic metal layers (not shown). These magnetic metal layers may, for example, comprise eight to twelve layers of materials such as PtMn, CoFe, Ru, and NiFe. The tunnel layer 110 comprises a dielectric, such as $Al_2O_3$, or MgO.

The hard layer 112 is preferably magnetized in a fixed direction, while the direction of magnetization of the soft layer 108 may be switched, changing the resistance of the magnetic memory stack 106. One bit of digital information may be stored in a magnetic memory stack 106 by running a current in the appropriate direction through the bit line 102 and the word line 104 that intersect at the magnetic memory stack 106, creating a sufficient magnetic field to set the direction of magnetization of the soft layer 108. Information may be read from a magnetic memory stack 106 by applying a voltage across the magnetic memory stack, and measuring the resistance. If the direction of magnetization of the soft layer 108 is parallel to the direction of magnetization of the hard layer 112, then the measured resistance will be low, representing a value of "0" for the bit. If the direction of magnetization of the soft layer 108 is anti-parallel to the direction of magnetization of the hard layer 112, then the resistance will be high, representing a value of "1".

It will be understood that the view shown in FIG. 1 is simplified, and that actual MRAM devices may include additional components. For example, in some MRAM designs, a transistor is coupled to each magnetic memory stack 106, for isolation. It will further be recognized that the view shown in FIG. 1 represents only a small portion of an actual MRAM device. Depending on the organization and memory capacity of the device, there may be hundreds or thousands of bit lines and word lines in a memory array. For example, a 1 Mb MRAM device (i.e., an MRAM device storing approximately one million bits of data) may include two arrays, each of which has 1024 word lines and 512 bit lines. Additionally, in some MRAM devices, there may be multiple layers of magnetic memory stacks, in which layers may share bit lines or word lines.

In an alternative embodiment of the invention, an architecture is provided with an MTJ and at least one select transistor for each memory cell.

Figure 2:
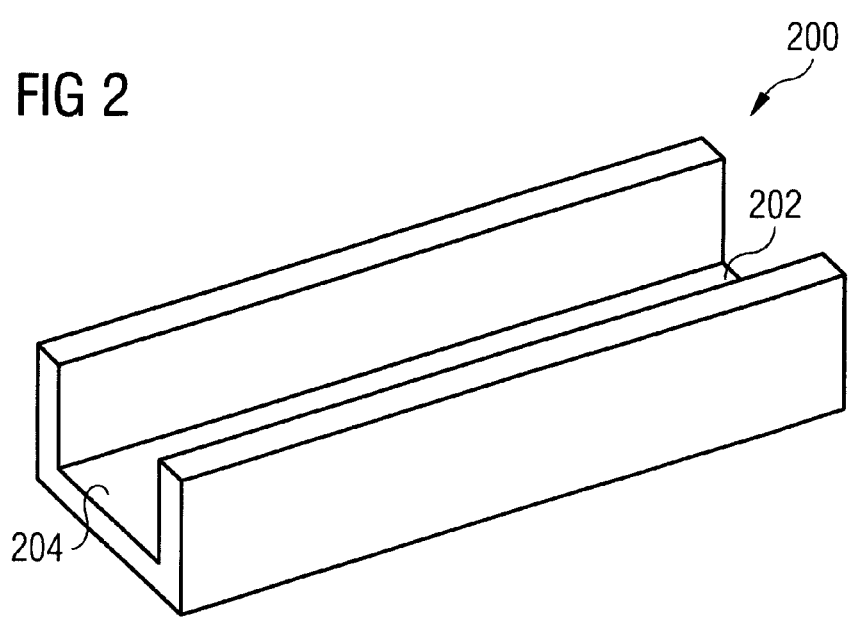
FIG. 2 shows a perspective view of a magnetic liner that may partially surround a word line or bit line in an MRAM array.

Referring now to FIG. 2, a magnetic liner (also called cladding) is described. A magnetic liner 200 preferably comprises a U-shaped line of a magnetic material, such as NiFe, with walls having a thickness of, for example, 10 to 20 nm. The magnetic liner 200 is magnetized so that it has a positive end 202 and a negative end 204. The magnetic liner 200 is typically disposed and scaled to surround three sides of a bit line or word line. It should be mentioned that the magnetic liner can be implemented according to different embodiments of the invention for only the bit line, for only the word lines or for the bit lines and the word lines. This means that the magnetic liner can also be provided as an upside down magnetic liner.

When surrounding a write line (i.e., a bit line or word line), the magnetic liner 200 serves as a flux concentrator, focusing the magnetic field created by running current through the write line. This reduces by a factor of two or more the amount of current that is required to generate a magnetic field sufficient to switch the direction of magnetization of the soft layer of an MTJ.

In addition to focusing the magnetic field of a write line, the magnetic liner 200 generates its own "stray" magnetic field. At the ends of the magnetic liner 200, this stray field is particularly strong, and may cause an inhomogeneous offset field over a portion of the memory array.

Figure 3:
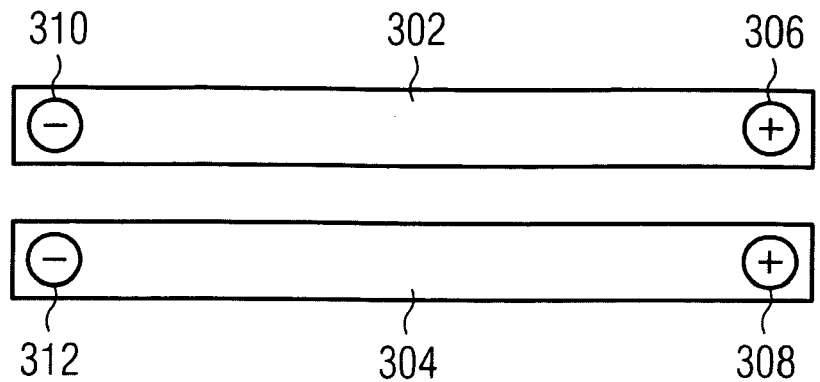
FIG. 3 shows a configuration of two parallel magnetic liners.

In FIG. 3, a prior art arrangement of two adjacent magnetic liners is shown. Magnetic liners 302 and 304 are arranged in parallel, and may surround bit lines or word lines. For clarity, the side walls of magnetic liners 302 and 304 are not shown. It will be understood that magnetic liners 302 and 304 form a small part of a magnetic liner structure, that includes magnetic liners that surround each of the bit lines or word lines.

Because they are magnetic, magnetic liners 302 and 304 have magnetic poles at their ends. Magnetic liners 302 and 304 are oriented so that their positive end poles 306 and 308 are adjacent, as are their negative end poles 310 and 312. In this orientation, the end poles of the magnetic liners 302 and 304 add up, causing a high offset field around both ends of the magnetic liners 302 and 304. In an actual MRAM device, there would be many such identically oriented magnetic liners surrounding the bit lines and/or word lines, increasing the offset magnetic field.

Figure 4:
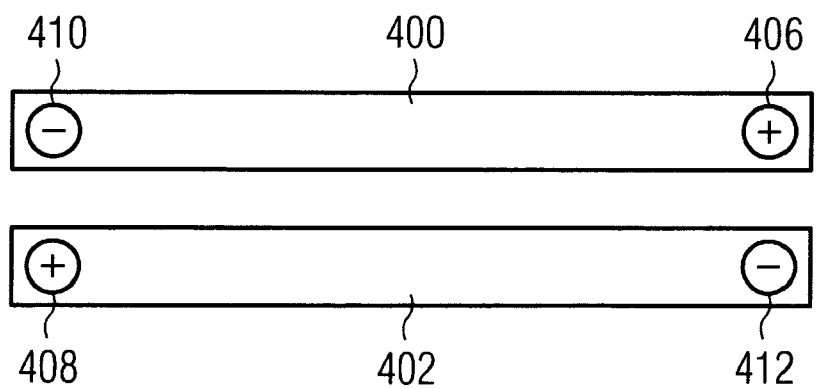
FIG. 4 shows two parallel magnetic liners having opposite orientations of magnetization, in accordance with various embodiments of the present invention.

As shown in FIG. 4, in accordance with the invention, it would be desirable to alternate the orientation of magnetization of adjacent magnetic liners in a magnetic liner structure, so that the orientation of magnetization of a magnetic liner 400 is anti-parallel to the orientation of magnetization of an adjacent magnetic liner 402. This places the positive end pole 406 of the magnetic liner 400 near the negative end pole 412 of the adjacent magnetic liner 402, the negative pole 410 of the magnetic liner 400 near the positive pole 408 of the adjacent magnetic liner 402.

In this configuration, the end poles of the magnetic liners 400 and 402 cancel each other, reducing the offset magnetic field. In the limit, the end poles cancel completely (i.e., there is flux closure between the magnetic liners), and the offset field is eliminated.

The principal technical issue with this solution is arranging the orientation of magnetization of the magnetic liners so that their orientations alternate. Generally, the orientation of magnetization of a magnetic liner may be reversed by the application of a magnetic field of a particular strength, known as a "switching field". The switching field of the magnetic liner 400 is substantially the same as the switching field of the magnetic liner 402. Thus, when a magnetic field of sufficient strength is applied, the magnetic liners 400 and 402 will both switch their orientation according to the direction of the field, and both of the magnetic liners 400 and 402 will be oriented in the same direction.

As is known in the art, the shape of the ends of small, elongated magnetic elements, such as the magnetic liners used in MRAM devices, plays an important role in determining the switching field for such elements, as described in K. J. Kirk, et al., "Switching fields and magnetostatic interactions of thin film magnetic nanoelements," Applied Physics Letters, Volume 71, (4), pp. 539 to 541, July 1997, which is hereby incorporated by reference in its entirety. By changing the shape of the ends of a magnetic liner, its switching field may be varied by almost an order of magnitude. This is due to variations in the end domain structure of the magnetic liners that depend on the shapes of the ends. For example, in a magnetic liner having pointed ends, the end domains will be suppressed, and the switching field will be substantially higher than in a magnetic liner having blunt ends. In accordance with embodiments of the invention, this property is used to arrange an alternating orientation of magnetization for magnetic liners. It should be mentioned that the two ends of the magnetic liner can also have different end shapes, in other words, the two ends of the magnetic liner do not need to have an identical shape. It further should be noted that the end shapes can differ from the shapes that have been disclosed in this description, e.g., the shapes as described in Kirk, et al. can also be used.

Figure 5:
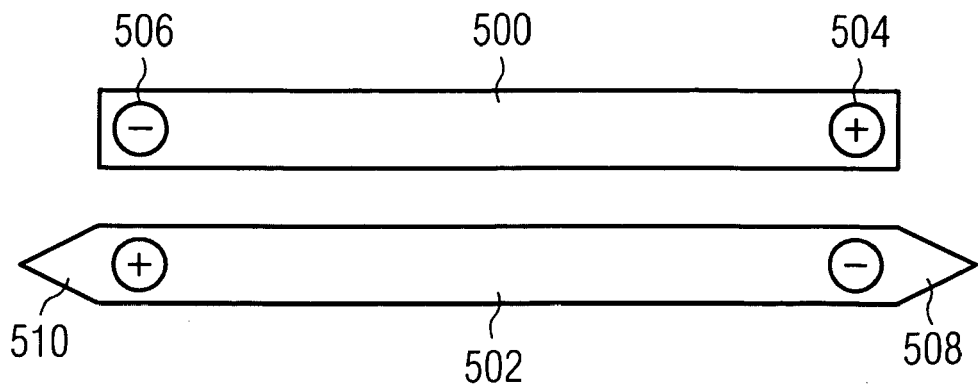
FIG. 5 shows two parallel magnetic liners having different end shapes, in accordance with an embodiment of the present invention.

As shown in FIG. 5, in accordance with an embodiment of the invention, the end shapes of the magnetic liners may be alternated. Thus, a magnetic liner 500 has blunt ends 504 and 506, and an adjacent magnetic liner 502 has pointed ends 508 and 510. The blunt ends 504 and 506 of the magnetic liner 500 provide end domains that result in a low switching field for the magnetic liner 500, which will be referred to as $H_{c1}$. The pointed ends 508 and 510 of the magnetic liner 502 suppress the end domains, and result in a high switching field for the magnetic liner 502. This high switching field will be referred to as $H_{c2}$. As described below, this relation of the switching fields, $H_{c2}>H_{c1}$, may be used to arrange the alternating orientations of magnetization of the magnetic liners 500 and 502.

Figure 6:
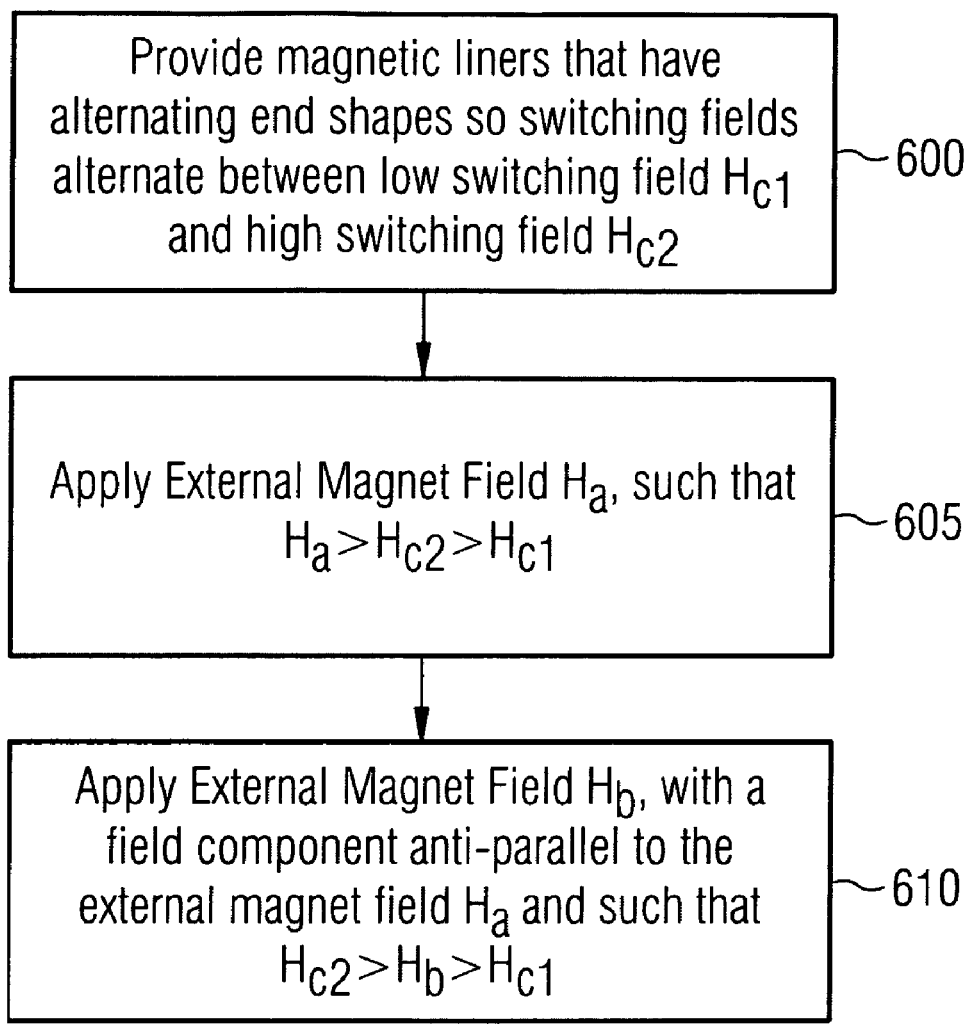
FIG. 6 is a block diagram illustrating a process of setting the alternating magnetic orientations of magnetic liners, in accordance with various embodiments of the invention.

FIG. 6 is a block diagram showing a method for alternating the orientations of magnetization of magnetic liners, in accordance with an embodiment of the invention. In step 600, magnetic liners are provided with alternating end shapes, such that the magnetic liners alternate between having a low switching field, $H_{c1}$ and a high switching field, $H_{c2}$.

In step 605, an external magnetic field, $H_a$, is applied to the entire set of magnetic liners (i.e., the entire magnetic liner structure), such that $H_a>H_{c2}>H_{c1}$. This causes all of the magnetic liners in the magnetic liner structure to switch their orientation of magnetization to the same direction, determined by the magnetic field $H_a$.

In step 610, another external magnetic field, $H_b$, is applied to the entire magnetic liner structure, such that $H_{c2}>H_b>H_{c1}$. $H_b$ has a direction opposite that of $H_a$. Generally speaking, the external magnetic field, $H_b$, has a magnetic field component, the direction of which is anti-parallel to the direction of the magnetic field $H_a$. This causes all of the magnetic liners with switching field $H_{c1}$ to change their orientation of magnetization, and does not affect the orientation of magnetization of the magnetic liners with switching field $H_{c2}$. Thus, the orientation of magnetization of the magnetic liners is alternated, so that their magnetic end poles can cancel each other, and reduce (or eliminate) the offset field.

Figure 7A:
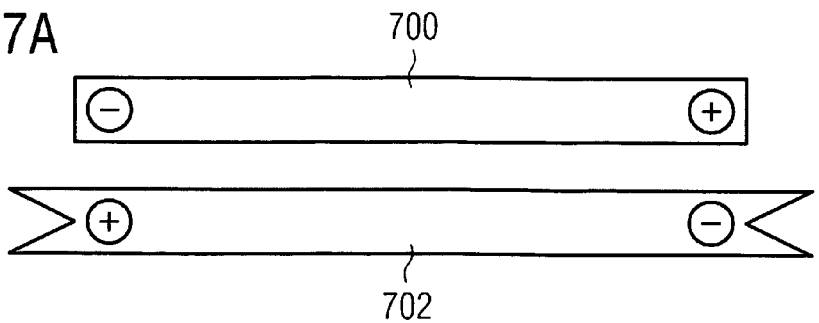
FIGS. 7A-7C show configurations of two or more magnetic liners having alternating magnetic orientation and end configurations, in accordance with various embodiments of the present invention.
Figure 7B:
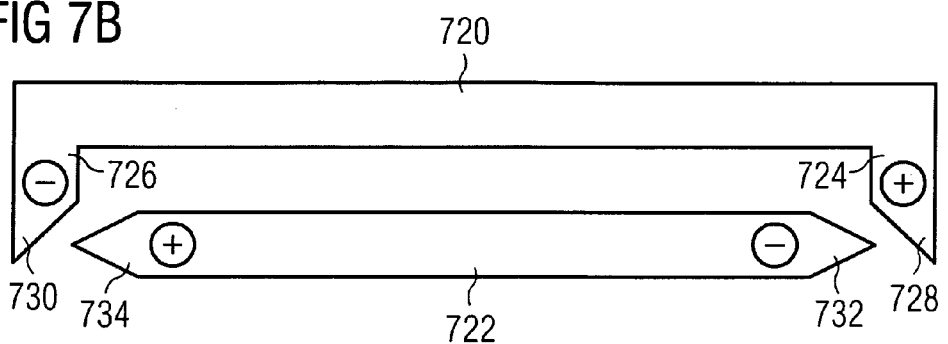
Figure 7C:
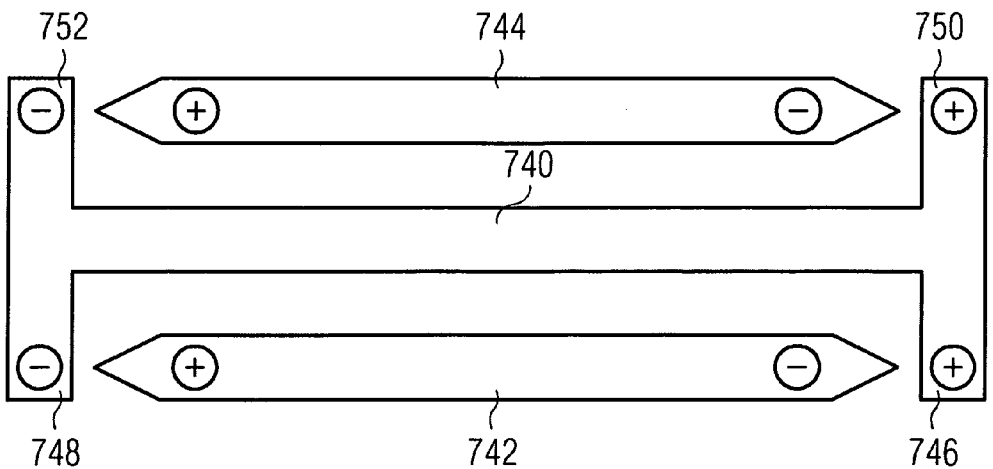

Referring now to FIGS. 7A-7C, additional embodiments in accordance with the invention are described. In the embodiment shown in FIG. 7A, the ends of a magnetic liner 700 are blunt, and the ends of an adjacent magnetic liner 702 have a notched shape, with two points at their outer edges, surrounding a V-shaped notch. Each of these end configurations will result in a different switching field. As in previous embodiments, the blunt ends of the magnetic liner 700 will result in a low switching field for the magnetic liner 700, while the notched ends of the magnetic liner 702 will provide a higher switching field.

Because the switching fields are different, due to the differing end shapes, the method described above with reference to FIG. 6 may be used to alternate the orientation of magnetization of the magnetic liners 700 and 702. As in other embodiments, the alternating orientation causes cancellation of the end poles, and the reduction or elimination of the offset field that is normally associated with use of magnetic liners.

FIG. 7B shows an embodiment in which the ends of a magnetic liner 720 are bent at 90° angles, to form arms 724 and 726. The ends of the arms 724 and 726 are tapered to form points 728 and 730 at the outer edges of the arms 724 and 726. An adjacent magnetic liner 722 has pointed ends 732 and 734, and is disposed so that it is partially surrounded by the arms 724 and 726 of the magnetic liner 720.

The differing end configurations of the magnetic liners 720 and 722 will result in the liners having substantially different switching fields. The bent- and tapered-shaped of the ends of the magnetic liner 720 will result in a low switching field, while the pointed ends of the magnetic liner 722 will result in a relatively high switching field. Thus, the method described above with reference to FIG. 6 may be used to alternate the orientation of magnetization of the magnetic liners 720 and 722.

Advantageously, the configuration of the magnetic liners 720 and 722 shown in FIG. 7B, in which the magnetic liners 720 and 722 almost form a loop, provides very stable magnetic flux closure of the alternating liners. This will result in improved reduction of the offset field, and in less domain wall movement within the liners. With respect to the offset field reduction, this results in a larger write window as the switching field for writing an MTJ cell is more homogeneous across the array. With respect to the domain wall movement within the liners, the switching field fluctuation due to the existence of the magnetic domains within the liners is reduced due to the suppression of the domain walls.

FIG. 7C shows an embodiment in which more than two magnetic liners are arranged into a pattern that may be repeated in a magnetic liner structure. In this embodiment, a magnetic liner 740 includes blunt-ended T-shaped arms at each end. Arms 746 and 748 partially surround an adjacent magnetic liner 742, and arms 750 and 752 partially surround a second adjacent magnetic liner 744. Both of the adjacent magnetic liners 742 and 744 have pointed ends. As with other embodiments, the differences in end shapes will result in differences in switching fields. This will enable the method described with reference to FIG. 6 to be used to create alternating magnetic orientation in the magnetic liners. In this embodiment, the magnetic liner 740 has an opposite magnetic orientation from the adjacent magnetic liners 742 and 744. Thus, the end poles of the magnetic liners 742 and 744 will cancel with the end poles of the arms 746, 748, 750, and 752 of the magnetic liner 740. Additionally, because the arms 746, 748, 750, and 752 partially surround the magnetic liners 742 and 744, the overall configuration provides stable flux closure between the magnetic liners.

From these example embodiments, it will be understood that, in general, different end shapes can be used to provide different switching fields in magnetic liners. These different switching fields enable the orientation of magnetization of the magnetic liners to be alternated. As a result, the charges at the end poles of adjacent magnetic liners cancel each other, leading to a reduction or elimination the offset field at the end regions of the magnetic liners. Many different end shapes and configurations may be used to provide different switching fields and flux closure.

Figure 8:
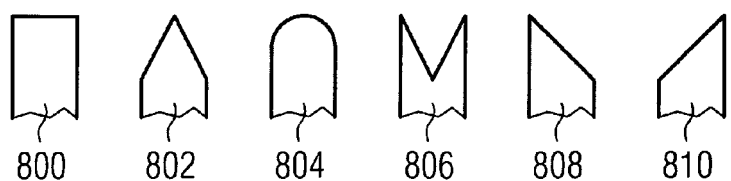
FIG. 8 shows examples of a variety of end shapes that may be used on magnetic liners to vary their switching fields, in accordance with various embodiments of the present invention.

FIG. 8 shows numerous end shapes that can be used to vary the switching fields of magnetic liners. A blunt end 800 generally has an end domain configuration that causes a relatively low switching field. A pointed end 802 suppresses end domains, and provides a switching field that is substantially higher than that of the blunt end 800. The switching field of a curved end 804 varies with the curvature, and can be high or low. These, as well as a notched end 806, tapered ends 808 and 810, and other possible end shapes all result in varying switching fields that can be used to alternate the magnetization orientation of magnetic liners, in accordance with various embodiments of the invention.

It should be mentioned that the end shapes of any part of the magnetic liner can be varied according to the above-described principles. For example, the side elements as shown in FIG. 9 can be formed such that the switching field is reduced.

Figure 9:
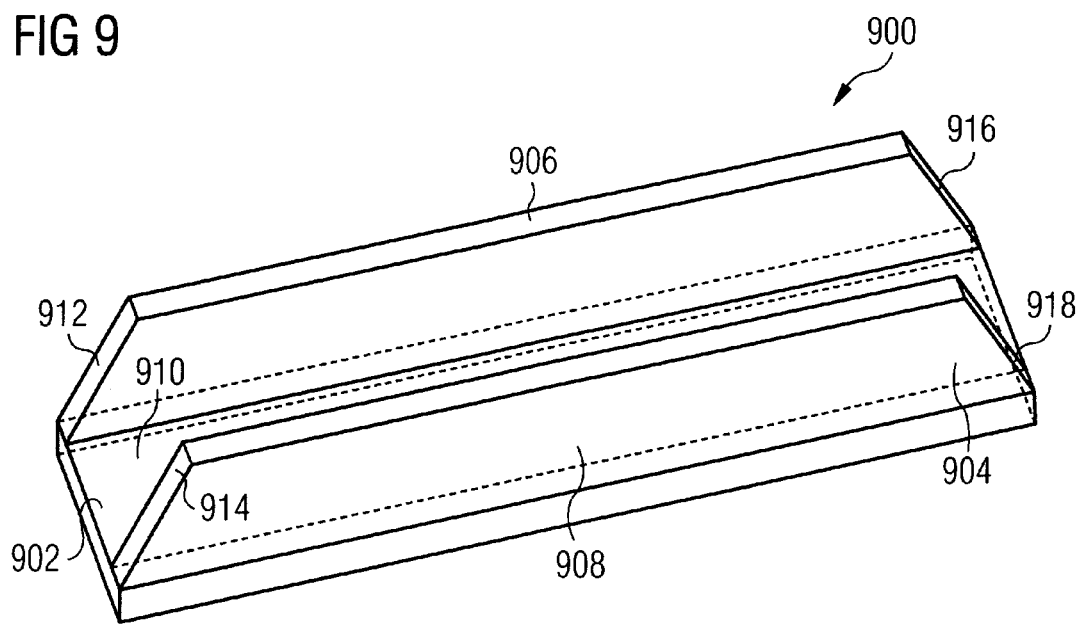
FIG. 9 shows a perspective view of a magnetic liner that may partially surround a word line or bit line in an MRAM array in accordance with another embodiment of the invention.

As shown in FIG. 9, a magnetic liner according to another embodiment of the invention also has a substantially U-shaped line of a magnetic material, such as NiFe, with walls having a thickness of, for example, 10 to 20 nm. The magnetic liner 900 is magnetized so that it has a positive end 902 and a negative end 904. The magnetic liner 900 is typically disposed and scaled to surround three sides of a bit line or word line. A first side wall 906 and a second side wall 908 respectively extend substantially vertically from a ground plate 910. The first side wall 906 and the second side wall 908 have respective inclined end portions 912, 914, 916, 918.

Figure 10:
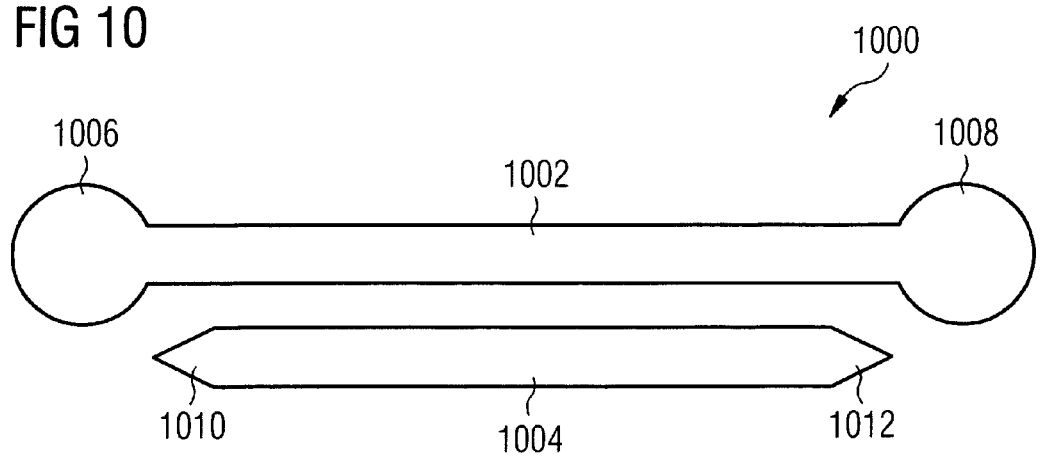
FIG. 10 shows a plan view of two adjacent magnetic liners in accordance with another embodiment of the invention.

Furthermore, it should be noted that adjacent magnetic liners can have different end shapes. As shown in a sketch 1000 in FIG. 10, a first magnetic liner 1002 can have a first type of end shape, e.g., a circular end shape 1006, 1008 on both its end regions, and a second magnetic liner 1004 can have a first type of end shape, e.g., a peak end shape 1010, 1012 on both its end regions.

In an alternative embodiment of the invention, the first liner and the second liner are provided in different metallization levels.

While the invention has been shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes that come within the meaning and range of equivalency of the claims are intended to be embraced.

What is claimed is:

1. A magnetic liner structure for use on a plurality of write lines in a magnetoresistive memory device, the magnetic liner structure comprising:
   a first magnetic liner having an orientation of magnetization in a first direction; and
   a second magnetic liner disposed adjacent to the first magnetic liner, such that at least a portion of the second magnetic liner extends in a direction substantially parallel to the first magnetic liner, the second magnetic liner having an orientation of magnetization in a second direction substantially anti-parallel to the first direction.

2. The magnetic liner structure of claim 1, wherein ends of the first magnetic liner have a first end shape, and ends of the second magnetic liner have a second end shape different from the first end shape.

3. The magnetic liner structure of claim 2, wherein the first end shape causes the first magnetic liner to have a first switching field, and the second end shape causes the second magnetic liner to have a second switching field that is greater than the first switching field.

4. The magnetic liner structure of claim 2, wherein the first end shape is blunt and the second end shape is pointed.

5. The magnetic liner structure of claim 2, wherein the first end shape is blunt and the second end shape is notched.

6. The magnetic liner structure of claim 2, wherein the first magnetic liner further comprises opposing arm structures at its ends, such that the arm structures partially enclose the ends of the second magnetic liner to provide a partial loop having stable magnetic flux closure.

7. The magnetic liner structure of claim 6, wherein the arm structures extend in a direction substantially perpendicular to a length of the first magnetic liner.

8. The magnetic liner structure of claim 6, wherein ends of the opposing arm structures have a tapered shape, and the second end shape is pointed.

9. The magnetic liner structure of claim 2, further comprising a third magnetic liner disposed adjacent to the first magnetic liner, such that at least a portion of the third magnetic liner extends in a direction substantially parallel to the first magnetic liner, the third magnetic liner having an orientation of magnetization in the second direction.

10. The magnetic liner structure of claim 9, wherein the first magnetic liner further comprises opposing arm structures at its ends, the arm structures extending in a direction substantially perpendicular to the length of the first magnetic liner in both directions, such that the arm structures partially enclose the ends of the second magnetic liner and the third magnetic liner.

11. The magnetic liner structure of claim 2, wherein the first and second end shapes are selected from a group of end shapes consisting of a blunt end shape, a rounded end shape, a pointed end shape, a notched end shape, and a tapered end shape.

12. The magnetic liner structure of claim 1, wherein the first magnetic liner and the second magnetic liner are arranged in different metallization levels.

13. A method of aligning an orientation of magnetization of two or more adjacent magnetic liners in a magnetic liner structure for use in a magnetoresistive memory device, such that the orientations of magnetization of the adjacent magnetic liners are anti-parallel to each other, the method comprising:
   providing a first magnetic liner in the magnetic liner structure, the first magnetic liner having a first switching field;

providing a second magnetic liner adjacent to the first magnetic liner in the magnetic liner structure, the second magnetic liner having a second switching field greater than the first switching field;

applying a first magnetic field to the magnetic liner structure, the first magnetic field having a strength greater than the second switching field, the first magnetic field causing the first and second magnetic liners to switch their orientation of magnetization to a first direction; and applying a second magnetic field having a different direction to the first magnetic field to the magnetic liner structure, the second magnetic field having a strength greater than the first switching field and less than the second switching field, the second magnetic field causing the first magnetic liner to switch its orientation of magnetization to a second direction, the second direction different than the first direction.

14. The method of claim 13, wherein the direction of the second magnetic field is substantially anti-parallel to the direction of the first magnetic field.

15. The method of claim 13, wherein:

providing the first magnetic liner comprises providing the first magnetic liner with ends of a first shape; and providing the second magnetic liner comprises providing the second magnetic liner with ends of a second shape, different from the first shape.

16. A magnetic liner structure for use on a plurality of write lines in a magnetoresistive memory device, the magnetic liner structure comprising:

a first magnetic liner having a first end shape that causes the first magnetic liner to have a first switching field; and a second magnetic liner disposed adjacent to the first magnetic liner, such that at least a portion of the second magnetic liner extends in a direction substantially parallel to the first magnetic liner, the second magnetic liner having a second end shape that causes the second magnetic liner to have a second switching field different from the first switching field.

17. The magnetic liner structure of claim 16, wherein the first end shape is blunt and the second end shape is pointed.

18. The magnetic liner structure of claim 16, wherein the first end shape is blunt and the second end shape is notched.

19. The magnetic liner structure of claim 16, wherein the first magnetic liner further comprises opposing arm structures at its ends, such that the arm structures partially enclose the ends of the second magnetic liner to provide a partial loop having stable magnetic flux closure.

20. The magnetic liner structure of claim 16, further comprising a third magnetic liner disposed adjacent to the first magnetic liner, such that at least a portion of the third magnetic liner extends in a direction substantially parallel to the first magnetic liner, the third magnetic liner having an end shape different from the first end shape and a switching field different from the first switching field.

21. The magnetic liner structure of claim 20, wherein the first magnetic liner further comprises opposing arm structures at its ends, the arm structures extending in a direction substantially perpendicular to the length of the first magnetic liner in both directions, such that the arm structures partially enclose the ends of the second magnetic liner and the third magnetic liner.

22. The magnetic liner structure of claim 16, wherein the first and second end shapes are selected from a group of end shapes consisting of a blunt end shape, a rounded end shape, a pointed end shape, a notched end shape, and a tapered end shape.

* * * * *